US006998913B2

(12) United States Patent
DeGeronimo

(10) Patent No.: US 6,998,913 B2
(45) Date of Patent: Feb. 14, 2006

(54) METHOD AND APPARATUS FOR LINEAR LOW-FREQUENCY FEEDBACK IN MONOLITHIC LOW-NOISE CHARGE AMPLIFIERS

(75) Inventor: Gianluigi DeGeronimo, Nesconset, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 0 days.

(21) Appl. No.: 10/866,441

(22) Filed: Jun. 14, 2004

(65) Prior Publication Data

US 2005/0275455 A1    Dec. 15, 2005

(51) Int. Cl.
*H03F 1/36* (2006.01)
*H03F 1/38* (2006.01)
*H03F 3/04* (2006.01)
(52) U.S. Cl. .................... 330/85; 330/288; 330/291
(58) Field of Classification Search ............... 330/85, 330/288, 291
See application file for complete search history.

(56) References Cited

U.S. PATENT DOCUMENTS

| 5,792,956 | A | * | 8/1998 | Li ........................... 73/660 |
| 5,793,254 | A |   | 8/1998 | O'Connor |
| 5,793,257 | A | * | 8/1998 | Inanami et al. .............. 331/17 |
| 5,892,540 | A | * | 4/1999 | Kozlowski et al. ......... 348/300 |
| 6,512,399 | B1 |   | 1/2003 | De Geronimo |

OTHER PUBLICATIONS

M. Sampietro, et al., "Current Mirror Reset for Low-Power BiCMOS Charge Amplifier", *Nuclear Instruments and Methods in Physics Research*, A439, pp. 373-377 (2000).

L. Blanquart, et al., "XPAD, A New Read-Out Pixel Chip for X-Ray Counting", *Nuclear Science Symposium Conference Record IEEE*, vol. 2, pp. 92-97(2001).
F. Krummenacher, "Pixel Detectors with Local Intelligence: An IC Designer Point of View", *Nuclear Instruments and Methods in Physics Research*, A305, pp. 527-532 (1991).
B. Ludewigt, et al., "A High Rate, Low Noise, X-Ray Silicon Strip Detector System", *IEEE Transactions on Nuclear Science*, vol. 41, No. 4, pp. 1037-1041 (1994).
P.F. Manfredi, et al., "The Analog Front-End Section of the BaBar Silicon Vertex Tracker Readout IC", *Nuclear Physics B* (Proc. Suppl.), vol. 61B, pp. 532-538 (1998).
G. DeGeronimo, et al., "Front-End ASIC for a GEM Based Time Projection Chamber", *Proceedings of IEEE Nuclear Science Symposium*, (2003).
G. Bertuccio, et al., "MOSFET Diode as a Feedback Reset Element on Charge Amplifiers", *IEEE Transactions on Nuclear Science*, vol. 46, No. 3, pp. 757-760 (1999).

(Continued)

*Primary Examiner*—Patricia Nguyen
(74) *Attorney, Agent, or Firm*—Margaret C. Borgosian

(57) ABSTRACT

A charge amplifier includes an amplifier, feedback circuit, and cancellation circuit. The feedback circuit includes a capacitor, inverter, and current mirror. The capacitor is coupled across the signal amplifier, the inverter is coupled to the output of the signal amplifier, and the current mirror is coupled to the input of the signal amplifier. The cancellation circuit is coupled to the output of the signal amplifier. A method of charge amplification includes providing a signal amplifier; coupling a first capacitor across the signal amplifier; coupling an inverter to the output of the signal amplifier; coupling a current mirror to the input of the signal amplifier; and coupling a cancellation circuit to the output of the signal amplifier. A front-end system for use with radiation sensors includes a charge amplifier and a current amplifier, shaping amplifier, baseline stabilizer, discriminator, peak detector, timing detector, and logic circuit coupled to the charge amplifier.

27 Claims, 11 Drawing Sheets

OTHER PUBLICATIONS

G. De Geronimo et al., "A CMOS Fully Compensated Continuous Reset System", *IEEE Transactions on Nuclear Science*, vol. 47, No. 4, pp. 1458-1462 (2000).

P. O'Connor et al., "Ultra Low Noise CMOS Preamplifier-Shaper for X-Ray Spectroscopy", *Nuclear Instruments and Methods in Physics Research*, A409, pp. 315-321 (1998).

R.L. Chase, et al., "8-Channel CMOS Preamplifier and Shaper with Adjustable Peaking Time and Automatic Pole-Zero Cancellation", *Nuclear Instruments and Methods in Physics Research*, A409, pp. 328-331 (1998).

M. Sampierto, et al., "Zero-Power Current Conveyor for DC Stabilization and System Reset of Fast Current Pulse Amplifiers", *IEEE Electronics Letters*, vol. 34, No. 19, pp. 1801-1802 (1998).

R.C. Dorf, "The Electrical Engineering Handbook", pp. 564-566 (1993).

G. De Geronimo, et al., "Analog CMOS Peak Detect and Hold Circuits. Part 2. The Two-Phase Offset-Free and Derandomizing Configuration", *Nuclear Instruments and Methods in Physics Research*, A484, pp. 544-556 (2002).

G. De Geronimo, et al., "Development of a High-Rate High-Resolution Detector for EXAFS Experiments", *IEEE Transactions on Nuclear Science*, vol. 50, No. 4, pp. 885-891 (2003).

G. De Geronimo, et al., "A CMOS Baseline Holder (BLH) for Readout ASICs", *IEEE Transactions on Nuclear Science*, vol. 47, No. 3, pp. 818-822 (2000).

* cited by examiner

Classical Case: Total Output Noise 645μV (M2+M3=131μV)

Compensated Case: Total Output Noise540μV (M2+M3=94fV)

METHOD AND APPARATUS FOR LINEAR LOW-FREQUENCY FEEDBACK IN MONOLITHIC LOW-NOISE CHARGE AMPLIFIERS

This invention was made with Government support under contract number DE-AC02-98CH10886, awarded by the U.S. Department of Energy. The Government has certain rights in the invention.

BACKGROUND OF THE INVENTION

1. Field of the Invention

The present invention relates to charge sensitive amplifiers, and more particularly relates to a charge sensitive amplifier for use on monolithic substrates, which includes a low-noise, active feedback element that exhibits improved linearity and dynamic range.

2. Description of the Prior Art

Charge sensitive amplifiers are used in a variety of commercial, industrial, medical, and scientific instrumentation applications where a signal from a sensor is provided in the form of a small current charge that requires amplification prior to further signal processing or conditioning. These sensors may include low-capacitance silicon detectors, such as those used in particle position sensing, X-ray spectroscopy, and X-ray imaging, as well as sensors used to detect gamma rays emitted in mammography systems, and other low charge output sensing devices.

Charge sensitive amplifiers generally require a high-value feedback resistor to achieve low noise performance. However, high-value resistors are difficult to implement using conventional complimentary metal oxide semiconductor (CMOS) fabrication methods. Circuit configurations have been used in the prior art that include an active element to achieve the desired high resistance in a monolithically formed charge sensitive amplifier. These configurations suffer from several disadvantages, such as periods of inoperability, feedback instability, and very large variations in the resistance of the feedback element due to variations in process, temperature, and power supply voltage.

Charge sensitive amplifiers typically need low-frequency feedback to stabilize the operating point of the amplifier, discharge the feedback capacitor and, when applicable, to absorb leakage current from a corresponding sensor connected to the input of the amplifier. In discrete charge sensitive amplifiers, the feedback network includes a high-value resistor. In monolithic charge sensitive amplifiers, where high-value resistors cannot be integrated, active devices are used.

The major advantage in using active devices in the feedback network is that they are able to adapt to the value of the leakage current. The major drawbacks include non-linearity, noise contributions, and a voltage drop limiting the dynamic range available at the output of the amplifier.

These problems become even more critical as the supply voltage and metal oxide semiconductor field effect transistor (MOSFET) threshold voltage decrease. Conventional charge sensitive amplifiers are affected by at least one of these three major disadvantages.

FIG. 1 is a schematic diagram of a charge sensitive amplifier, which includes a signal amplifier 10 having an input terminal and an output terminal. The input terminal of the signal amplifier 10 is connected to a current supply 12, and a feedback capacitor C1 is connected in parallel across the input and output terminals of the signal amplifier 10.

The circuit also includes an n-channel MOSFET M1 having source, drain, and gate terminals. The drain terminal of MOSFET M1 is connected to the input terminal of the signal amplifier 10 and the source terminal of MOSFET M1 is connected to the output terminal of the signal amplifier 10. The circuit also includes at least one MOSFET M2 and at least one capacitor C2, which operate as a replicable pole-zero cancellation network. The capacitor C2 is connected in series between the output terminal of the signal amplifier 10 and an input terminal of a second signal amplifier 111 in a second amplification stage. A source terminal of MOSFET M2 is connected to the output terminal of the signal amplifier 10 and a drain terminal of MOSFET M2 is connected to the input terminal of the second signal amplifier 11. An impedance 14 is connected in parallel across the input and output terminals of the second signal amplifier 11 to provide feedback.

The configuration shown in FIG. 1 is typically used with CMOS technologies having minimum feature size down to 0.5 μm, which operate at supply voltages of about 3.3 voltages and above. However, this solution becomes substantially more difficult to use with more recent CMOS technologies of 0.25 μm or less, which need to be operated at supply voltages of 2.5 volts or less.

Additional details concerning the configuration shown in FIG. 1 are provided in U.S. Pat. No. 5,793,254; P. O'Connor et al., *Ultra Low Noise CMOS Preamplifier-Shaper for X-Ray Spectroscopy*, Nuclear Instruments and Methods in Physics Research, A 409, pp. 315–321 (1998); G. De Geronimo et al., *A Fully Compensated Continuous Reset System*, IEEE Transactions on Nuclear Science, Vol. 47, No. 4, pp. 1458–1462 (2000); and G. Bertuccio et al., *MOSFET Diode as a Feedback Reset Element on Charge Amplifiers*, IEEE Transactions on Nuclear Science, Vol. 46, No. 3, pp. 757–760 (1999), which are incorporated herein by reference.

MOSFET M2 and capacitor C2 may be replicated N times to provide for a current gain equal to N and the input operating points of amplifiers 10, 11 must be matched. However, an input operating point i1 of the amplifier 10 is about one threshold voltage above ground. The threshold voltage refers to the voltage difference between the gate and source terminals of the signal amplifier 10 required to turn the amplifier on. The output operating point o1, due to the polarity of a direct current (DC) component of an input current I, is thus lower than one threshold voltage of the amplifier 10. In response to a transient current pulse having the same polarity as the current I, the output node o1 must swing negatively and, with low voltage technologies that are characterized by small threshold voltages, the output dynamic range is severely limited in the configuration shown in FIG. 1.

FIG. 2 is a schematic diagram of another conventional charge sensitive amplifier configuration, which includes a signal amplifier 16 having input and output terminals. The circuit includes a capacitor C3 having an input terminal connected to the input terminal of the signal amplifier 16 and a drain terminal of a MOSFET M3. A source terminal of MOSFET M3 is connected to ground and a gate terminal of MOSFET M3 is connected to the gate and drain terminals of a MOSFET M5.

The source terminal of MOSFET M5 is connected to ground and MOSFETs M3, M5 function as a current mirror circuit. The output terminal of the signal amplifier 16 is connected to a gate terminal of a MOSFET M4, and a drain terminal of MOSFET M4 is connected to the drain terminal of MOSFET M5. The source terminal of MOSFET M4 is connected to the remaining terminal of capacitor C3, and a terminal of a resistor R1. The remaining terminal of resistor R1 is connected to a voltage supply $V_{DD}$.

The second configuration provides a current-to-voltage conversion equal to $1/(\omega C3)$ and the output dynamic range is larger than that of the configuration shown in FIG. 1. A discharge time consent of the feedback capacitor C3 is represented by the product of C3, R1 and n, where n represents a current mirror ratio, which is the ratio of the drain currents for MOSFETs M3, M5. However, the configuration shown in FIG. 2 is non-linear, that is, there is no pole-zero cancellation and the discharge of feedback capacitor C3 depends on the amplitude of the signal. In addition, the configuration shown in FIG. 2 is noisy, that is, the resistor R1 and MOSFETs M3, M4, M5 each contribute substantially to the noise generated by the feedback network.

Further details concerning the configuration shown in FIG. 2 are provided in M. Sampietro et al., *Zero-Power Current Conveyor for DC Stabilization and System Reset of Fast Current Pulse Amplifier*, IEEE Electronics Letters, Vol. 34, No. 19, pp. 1801–1802 (1998); and M. Sampietro et al., *Current Mirror Reset for Low-Power BiCMOS Charge Amplifier*, Nuclear Instruments and Methods in Physics Research A 439, pp. 373–377 (2000), which are incorporated herein by reference.

FIG. 3 is a block diagram of a preamplifier and shaper circuit for use with detectors in nuclear spectroscopy. One of the problems with such circuits concerns discharging the preamplifier feedback capacitor C4. For low parallel-noise, high-value resistors in the range of megohms are required. However, with complementary metal oxide semiconductor (CMOS) technology, realistic values can only be provided in the range of tens of kilohms.

To maintain a low discharge current, a current mirror technique using an amplifier, the schematic of which is shown in FIG. 4, is used as a bidirectional current source. By using this method, an equivalent resistor in the order of megohms may be realized in CMOS. The pole-zero cancellation portion 18 of the circuit uses an identical current mirror, which delivers current to the pole-zero circuit equal to the current discharging the preamplifier feedback capacitor C4.

In the preamplifier, a capacitor C6 represents the capacitance of the detector, which is connected across the input of the amplifier 20 and ground. The feedback capacitor C4 is connected in parallel across the input and output terminals of the amplifier 20. A decoupling capacitor C5 is connected in series between an output terminal of the signal amplifier 20 and the pole-zero cancellation network 18.

Additional details concerning the configuration shown in FIG. 3 are provided in R. L. Chase et al., *8-Channel CMOS Preamplifier and Shaper with Adjustable Peaking Time and Automatic Pole-Zero Cancellation*, Nuclear Instruments and Methods in Physics Research, A 409, pp. 328–331 (1998); L. Blanquart et al., XPAD, *A New Read-out Pixel Chip for X-Ray Imaging*, Nuclear Science Symposium Conference Record, IEEE, pp. 92–97, (2000), which are incorporated herein by reference.

The configuration shown in FIG. 3 provides a non-linear current gain equal to about −C5/C4 and the output dynamic range is larger than that of the circuit shown in FIG. 1. The discharge time constant of the feedback capacitor C4 is equal to the product of the values of C4, R2, and N, where N represents the total current scaling factor. However, the configuration shown in FIG. 4 is non-linear, that is, due to the low mirror current and voltage mismatches, pole-zero cancellation is fully effective only when C4 equals C5. In addition, this configuration is noisy, that is, resistor R2 and MOSFETs in the current mirror 22 contribute substantially to the noise generated by the feedback network.

FIG. 5 shows another conventional charge sensitive amplifier, which is configured as a differential feedback amplifier and includes a signal amplifier 24. An input terminal of the signal amplifier 24 is connected to a current supply 26 and a drain terminal of a MOSFET M6. A source terminal of MOSFET M6 is connected to ground and a gate terminal of MOSFET M6 is connected to a second current supply 28.

A drain terminal of a MOSFET M7 is connected to the second current supply 28 and a gate terminal of MOSFET M7 is connected to an output terminal of the signal amplifier 24. A feedback capacitor C7 is connected in parallel across the input and output terminals of the signal amplifier 24. A drain terminal of a MOSFET M8 is connected to the input terminal of the signal amplifier 24 and a source terminal of MOSFET M8 is connected to a voltage supply $V_{DD}$. A gate terminal of MOSFET M8 and a gate terminal of MOSFET M7 is connected to the voltage supply $V_{DD}$.

The amplifier shown in FIG. 5 provides a current-to-voltage conversion equal to $1/(\omega C7)$ with an output dynamic range larger than that of the configuration shown in FIG. 1. However, like the configuration shown in FIG. 2, the amplifier in FIG. 5 is non-linear due to the lack of pole-zero cancellation. Discharge of the feedback capacitor C7 depends on the amplitude of the signal. In addition, the configuration shown in FIG. 5 is noisy, that is, each of the MOSFETs M6, M7, M8 and voltage sources 26, 28, 30 contribute substantially to the noise generated by the feedback network.

In addition, this configuration is not self-adaptive to the sensor leakage current, that is, the maximum leakage current that can be absorbed by the circuit is equal to the tail current of the differential pair represented by MOSFETs M7, M8. Leakage currents greater than this value cannot be absorbed and the configuration exhibits excessive noise for detectors exhibiting leakage currents that are smaller than this value.

Further details concerning the amplifier configuration shown in FIG. 5 are provided in F. Krummenacher, *Pixel Detectors with Local Intelligence: An IC Designer Point of View*, Nuclear Instruments and Methods in Physics Research, A 305, pp. 527–532 (1991); B. Ludewigt et al., *A High Rate, Low Noise, X-ray Silicon Strip Detector System*, IEEE Transactions on Nuclear Science, Vol. 41, No. 4, pp. 1037–1041 (1994); and P. F. Manfredi et al., *The Analog Front-End Section of the BaBar Silicon Vertex Tracker Readout IC*, Nuclear Physics B (Proc. Suppl.), Vol. 61B, pp. 532–538 (1998), which are incorporated herein by reference.

Thus, each of the conventional charge sensitive amplifier configurations discussed above suffers from at least one of the three major disadvantages associated with active devices in a feedback network. These disadvantages being non-linearity, noise, and the dynamic range available at the output of the amplifier.

OBJECTS AND SUMMARY OF THE INVENTION

It is an object of the present invention to provide a charge sensitive amplifier with a stable, high-resistance feedback circuit, which maximizes dynamic range at its output while minimizing the number of components.

It is another object of the present invention to provide a charge sensitive amplifier with a stable, high-resistance feedback circuit, which has a low sensitivity to variations in both manufacturing process parameters, such as threshold voltage, and operating parameters, such as supply voltage and temperature.

It is yet another object of the present invention to provide a charge sensitive amplifier which has a stable, high-resistance feedback circuit with low-feedback capacitance.

It is still another object of the present invention to provide a charge sensitive amplifier with a stable, high-resistance feedback circuit that minimizes noise contributions and non-linearity.

It is a further object of the present invention to provide a charge sensitive amplifier, which has a stable, high-resistance feedback circuit that does not require adjustment after the amplifier is fabricated.

It is yet a further object of the present invention to provide a charge sensitive amplifier, which has a stable, high-resistance feedback circuit that remains continuously sensitive to input signals even in the presence of leakage current.

It is still a further object of the present invention to provide a charge sensitive amplifier, which has a stable, high-resistance feedback circuit that provides a compensating reduction in the feedback resistance in the presence of leakage current, thereby preventing the amplifier from saturating.

It is another object of the present invention to provide a charge sensitive amplifier with a stable, high-resistance feedback circuit, which can be manufactured using standard, commercially available, complimentary metal oxide semiconductor (CMOS) fabrication methods.

It is still another object of the present invention to provide a charge sensitive amplifier with a stable, high-resistance feedback circuit coupled to a cancellation circuit that compensates for the frequency response of the feedback circuit.

It is yet another object of the present invention to provide a pole-zero circuit for a charge sensitive amplifier having a stable, high resistance feedback circuit, which compensates for both the linear and non-linear characteristics of the feedback circuit.

It is a further object of the present invention to provide a charge sensitive amplifier with a stable, high resistance feedback circuit that is self-biasing.

In accordance with one form of the present invention, a charge amplifier includes a signal amplifier, a feedback circuit, and a cancellation circuit. The signal amplifier includes an input terminal and an output terminal. The feedback circuit includes a first capacitor, an inverter, and a current mirror circuit. The first capacitor is electrically coupled in parallel across the input terminal and the output terminal of the signal amplifier. The inverter is operatively coupled to the output terminal of the signal amplifier, and the current mirror circuit is operatively coupled to the input terminal of the signal amplifier. The cancellation circuit is operatively coupled to the output terminal of the signal amplifier. Additional capacitors may be operatively coupled between the input terminal of the signal amplifier and ground, and between the current mirror circuit and ground.

In accordance with another form of the present invention a method of charge amplification includes the steps of providing a signal amplifier; coupling a first capacitor electrically in parallel across the input terminal and the output terminal of the signal amplifier; coupling an inverter operatively to the output terminal of the signal amplifier; coupling a current mirror circuit operatively to the input terminal of the signal amplifier; and coupling a cancellation circuit operatively to the output terminal of the signal amplifier. The method may also include the steps of coupling another capacitor operatively between the input terminal of the signal amplifier and ground, and coupling another capacitor operatively coupled between the current mirror circuit and ground.

In accordance with yet another form of the present invention a front-end system for use with a radiation sensor includes a charge amplifier and at least one of a current amplifier, a shaping amplifier, a baseline stabilizer, a discriminator, a peak detector, a timing detector, and a logic circuit. The at least one of a current amplifier, shaping amplifier, baseline stabilizer, discriminator, peak detector, timing detector, and logic circuit is operatively coupled to the charge amplifier. The charge amplifier receives a signal from the radiation sensor representing detection of an event and includes a signal amplifier, a feedback circuit, and a cancellation circuit. The feedback circuit includes a first capacitor, an inverter, and a current mirror circuit. The first capacitor is electrically coupled in parallel across the input terminal and the output terminal of the signal amplifier. The inverter is operatively coupled to the output terminal of the signal amplifier, and the current mirror circuit is operatively coupled to the input terminal of the signal amplifier. The cancellation circuit is operatively coupled to the output terminal of the signal amplifier.

These and other objects, features, and advantages of this invention will become apparent from the following detailed description of illustrative embodiments thereof, which is to be read in connection with the accompanying drawings.

DETAILED DESCRIPTION OF THE PREFERRED EMBODIMENTS

Figure 6:
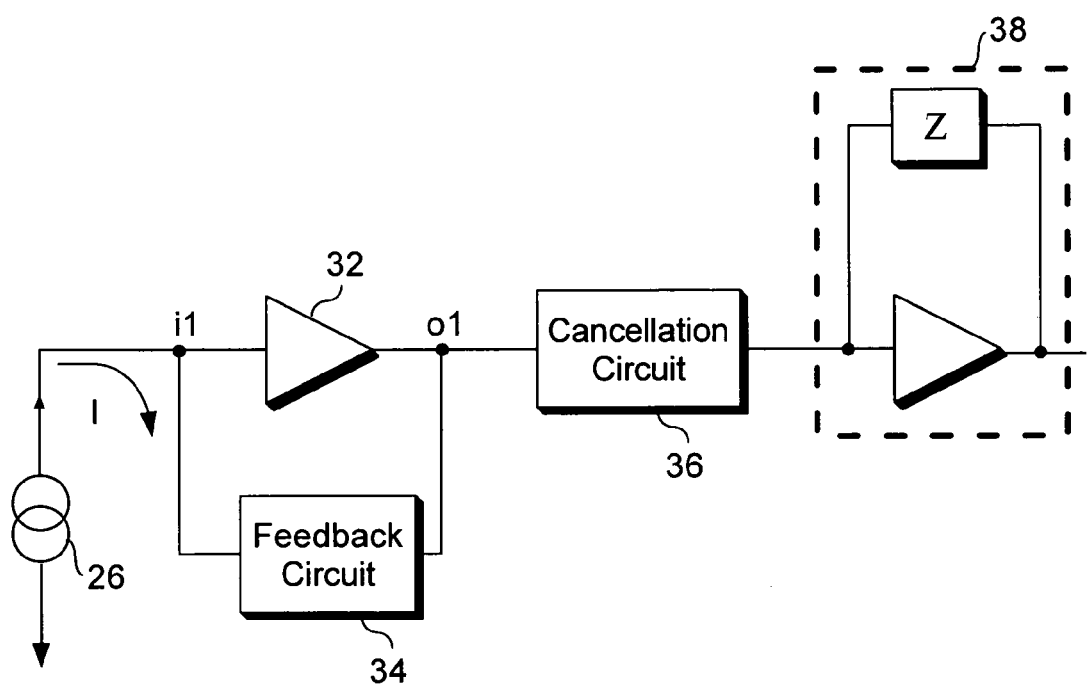
FIG. 6 is a block diagram of a charge sensitive amplifier formed in accordance with the present invention.

FIG. 6 shows a block diagram of a charge sensitive amplifier formed in accordance with the present invention, which includes an n-channel metal oxide semiconductor field effect transistor (MOSFET)-based signal amplifier 32 having an input terminal coupled to a current supply 26. A feedback circuit 34 is preferably coupled in parallel across the input and output terminals of the signal amplifier 32. A pole-zero cancellation circuit 36 is preferably coupled in series between the output terminal of the signal amplifier 32 and a second stage amplification circuit 38.

Figure 7:
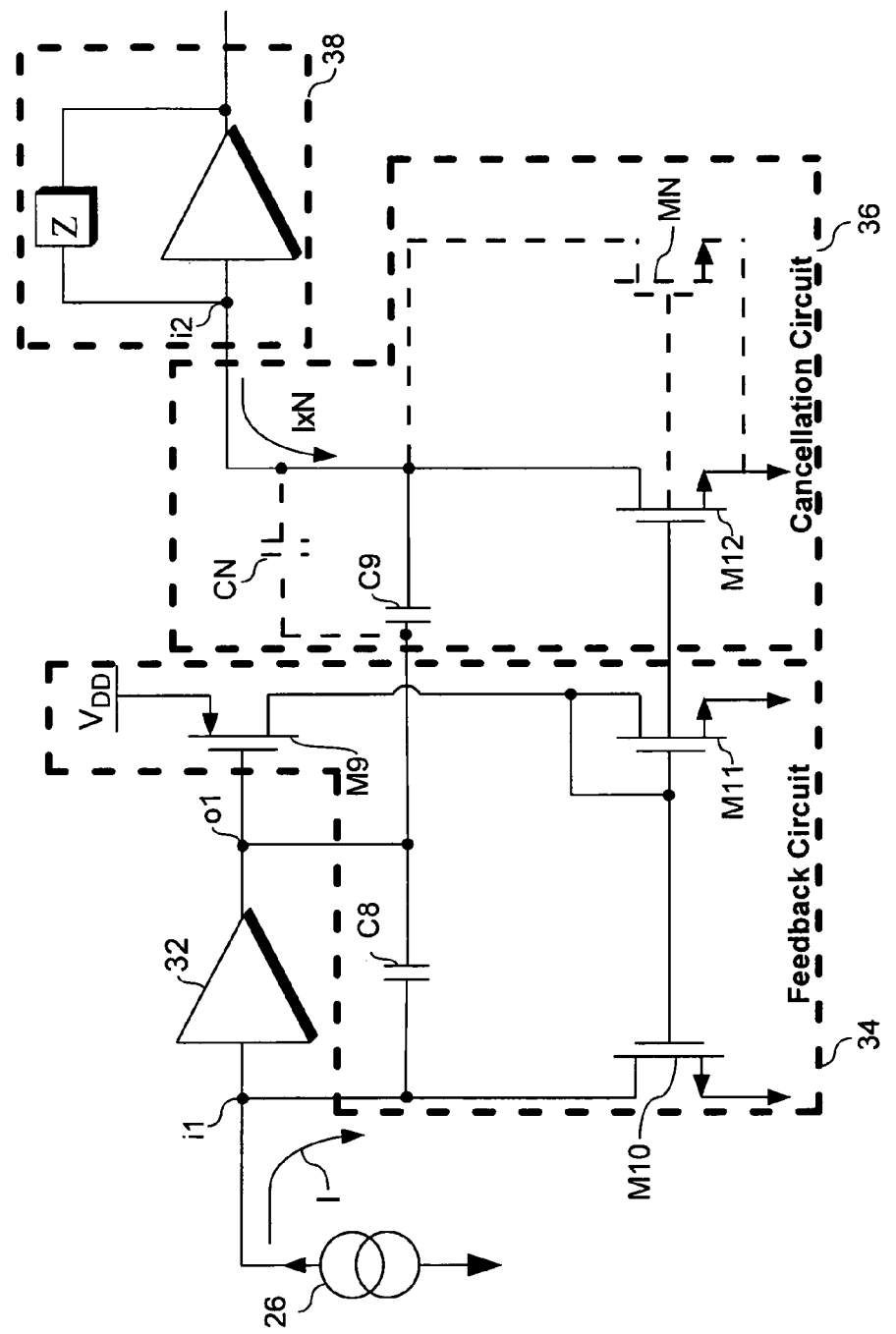
FIG. 7 is a more detailed schematic diagram of the charge sensitive amplifier shown in FIG. 6.

FIG. 7 shows a more detailed schematic representation of the charge sensitive amplifier shown in FIG. 6. For purposes of illustration, either n-channel MOSFETs or p-channel MOSFETs have been shown herein. However, it is to be understood that transistors of any type may be used, with modifications to the respective circuit that are well known in the art, while remaining within the scope of the present invention.

The feedback circuit 34 preferably includes a MOSFET M9 configured as an inverter having a gate terminal connected to the output terminal of the signal amplifier 32 and a source terminal connected to a voltage source $V_{DD}$. The feedback circuit 34 also preferably includes MOSFETs M10, M11 connected in a current mirror configuration.

The current mirror circuit is essentially an arrangement of two or more transistors such that a defined current passing into one of the transistors is mirrored in another transistor at a high resistance level, as further described in R. Dorf, *The Electrical Engineering Handbook*, pp. 564–566 (1993), which is incorporated herein by reference. The current mirror circuit in FIG. 7 preferably relies on the matching of the drain currents, or a scaling of the drain currents up or down as a predetermined ratio, of MOSFETs M10, M12 . . . MN. MOSFET M11 is configured as a diode and the gate terminals and source terminals of MOSFETs M10, M11 are connected together.

A drain terminal of MOSFET M110 is preferably connected to the input terminal of the signal amplifier 32, and the source terminals of MOSFETs M10, M11 are connected to ground. The gate terminal of MOSFET M10 is preferably connected to the gate terminal and a drain terminal of MOSFET M11, as well as a drain terminal of MOSFET M9. The feedback circuit 34 also preferably includes a feedback capacitor C8, which is connected in parallel across the input and output terminals of the signal amplifiers 32.

The cancellation circuit 36 preferably includes a MOSFET M12, a gate terminal of which is connected to the gate terminal of MOSFET M11. A source terminal of MOSFET M12 is preferably connected to ground, and a drain terminal of MOSFET M12 is connected to an input terminal of the second stage amplification circuit 38. The cancellation circuit 36 will also preferably includes a capacitor C9 connected in series between the output terminal of the signal amplifier 32 and the input terminal of the second stage amplification circuit 38.

The cancellation circuit 36 may also include additional capacitors CN, which are preferably connected in parallel with capacitor C9, as well as one or more additional MOSFET(s) MN, which are preferably connected in parallel with MOSFET M12. That is, the drain terminal of MOSFET(s) MN are preferably connected to the drain terminal of MOSFET M12, the source terminal of MOSFET(s) MN are preferably connected to the source terminal of MOSFET M12, and the gate terminal of MOSFET(s) MN are preferably connected to the gate terminal of MOSFET M12. MOSFET(s) M12 . . . MN are preferably substantial replica(s) of (or matched to) MOSFET M10, and capacitor(s) C9 . . . CN are preferably substantial replicas of (or matched to) capacitor C8. In this way, compensation and a gain of –N are achieved. The total number N of additional capacitors is preferably equal to the total number N of additional MOSFETs in the cancellation circuit 36.

The operation of MOSFET M9 or the inverter in conjunction with the current mirror circuit MOSFETs M10, M11, preferably absorb a leakage current I and discharges the feedback capacitor C8. Current gain and non-linearity cancellation are preferably achieved by capacitor(s) C9 . . . CN and MOSFET(s) M12 . . . MN in the cancellation circuit 36, which are essentially scaled N-times replicas of feedback capacitor C8 and MOSFET M10, respectively. An input operating point of i1 of the signal amplifier 32 preferably matches an input operating point i2 of the second stage amplification circuit 38. Current gain for the circuit shown in FIG. 7 preferably equals –N, where N is the replica coefficient of the capacitor(s) and MOSFET(s) in the cancellation circuit 36. This configuration is highly linear and provides for pole-zero cancellation through operation of the cancellation circuit 36. The non-linear discharge of the feedback capacitor C8 is preferably compensated for by the N-times replica cancellation network 36. MOSFET M10 and its N-times replica(s) M12 . . . MN preferably have substantially identical bias conditions.

Figure 1:
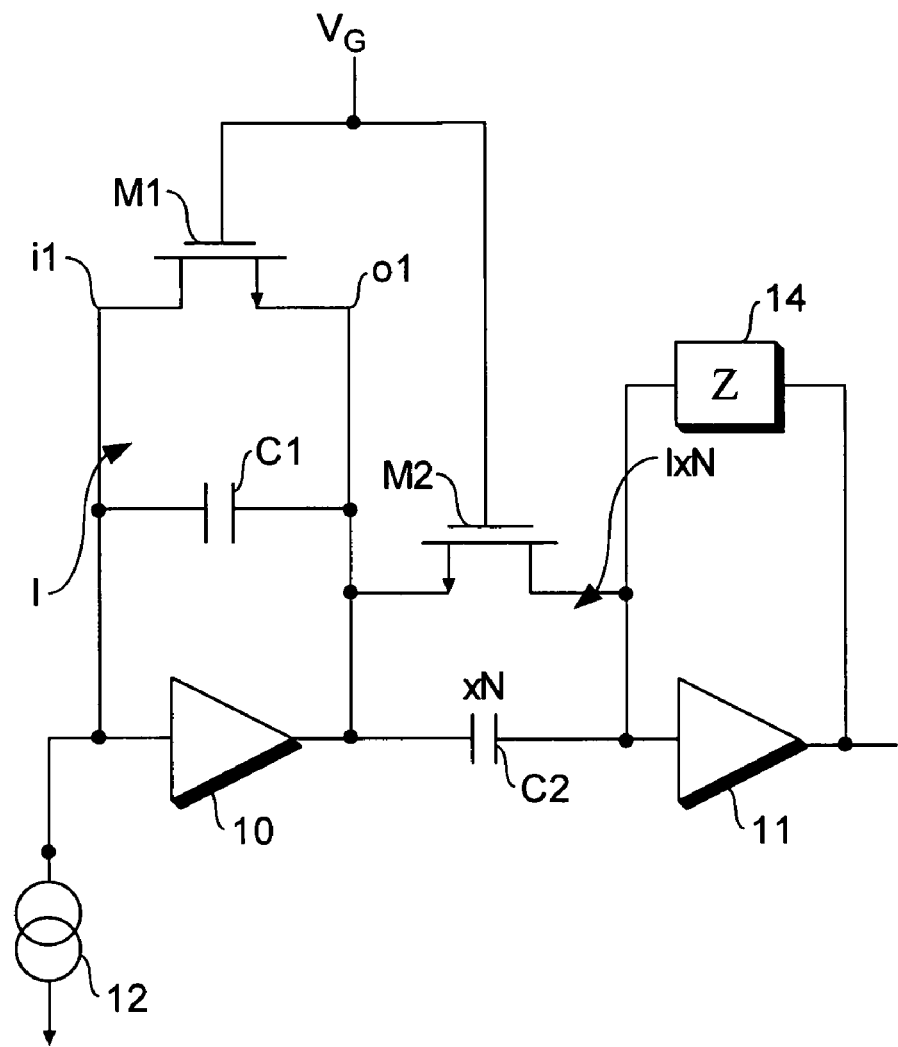
FIG. 1 is a schematic diagram of a first conventional charge sensitive amplifier.
Figure 2:
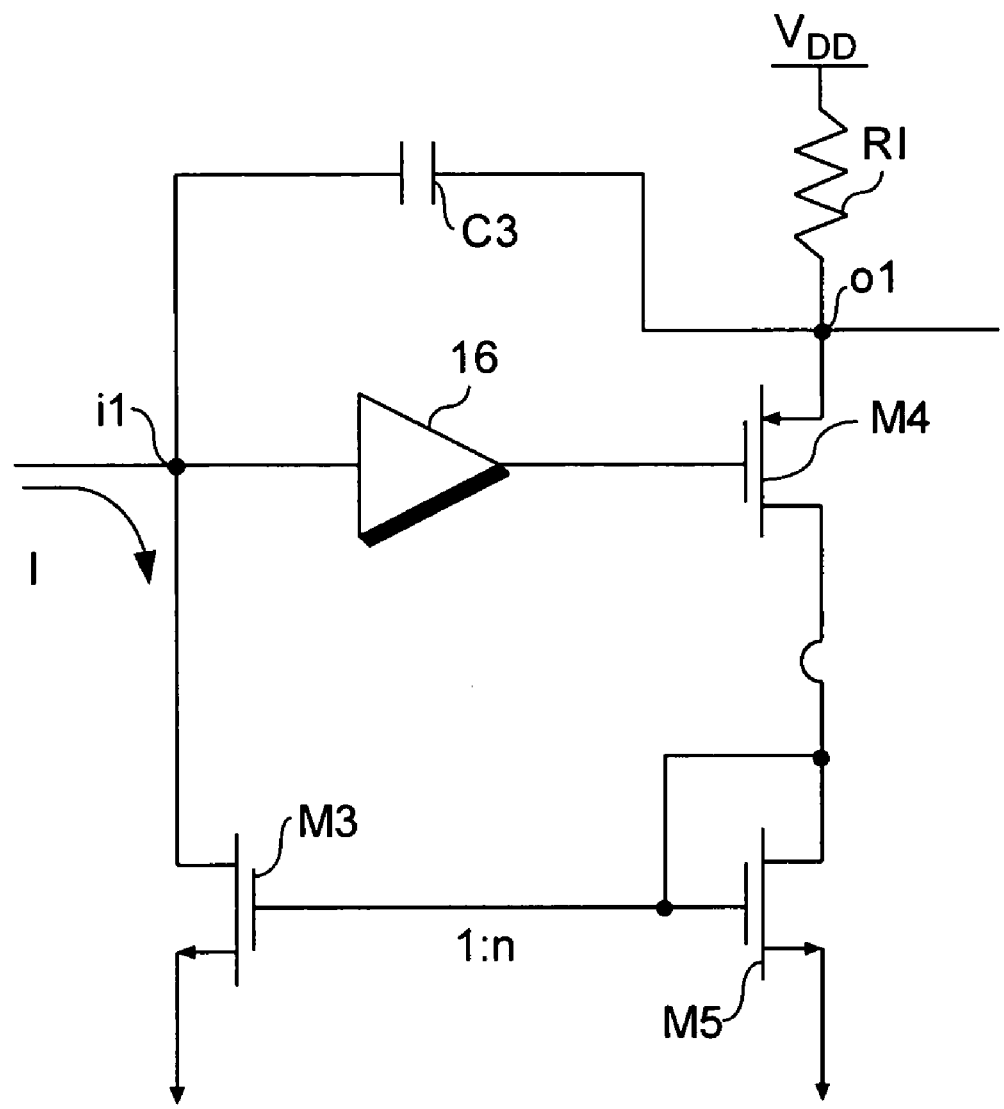
FIG. 2 is a schematic diagram of a second conventional charge sensitive amplifier.
Figure 3:
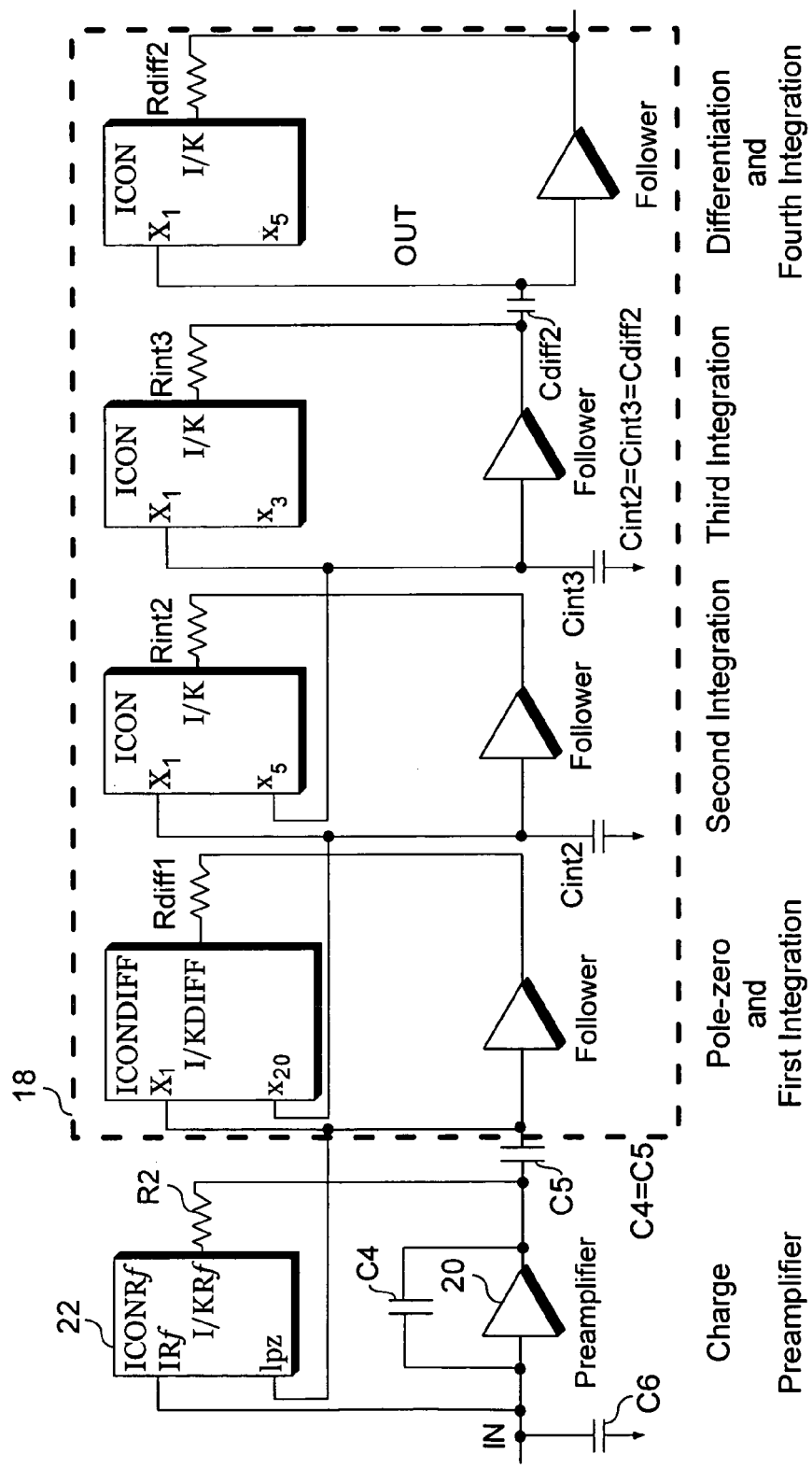
FIG. 3 is a block diagram of a conventional preamplifier and shaper circuit for use with detectors.
Figure 4:
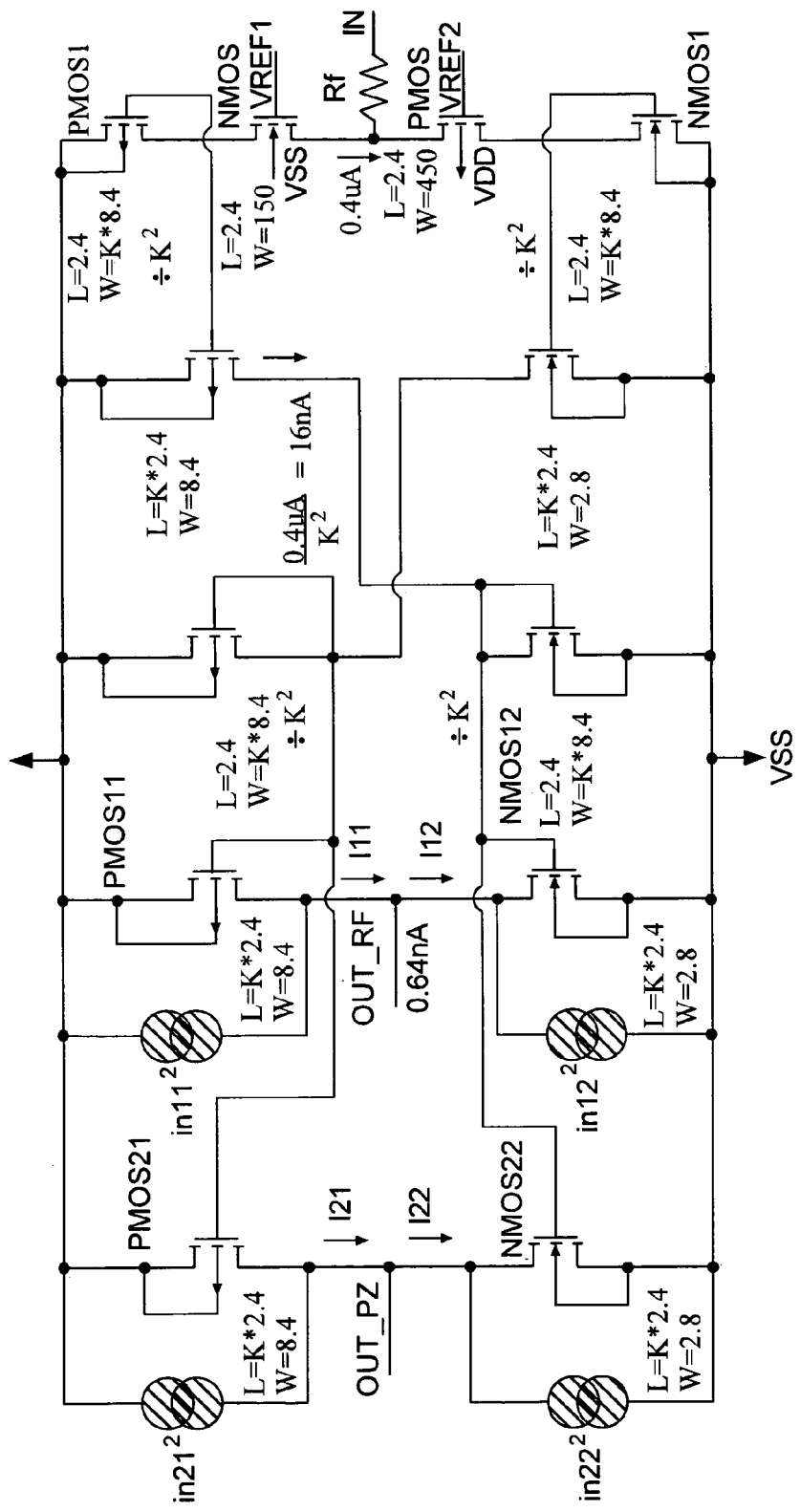
FIG. 4 is a more detailed schematic diagram of the circuit shown in FIG. 3.
Figure 5:
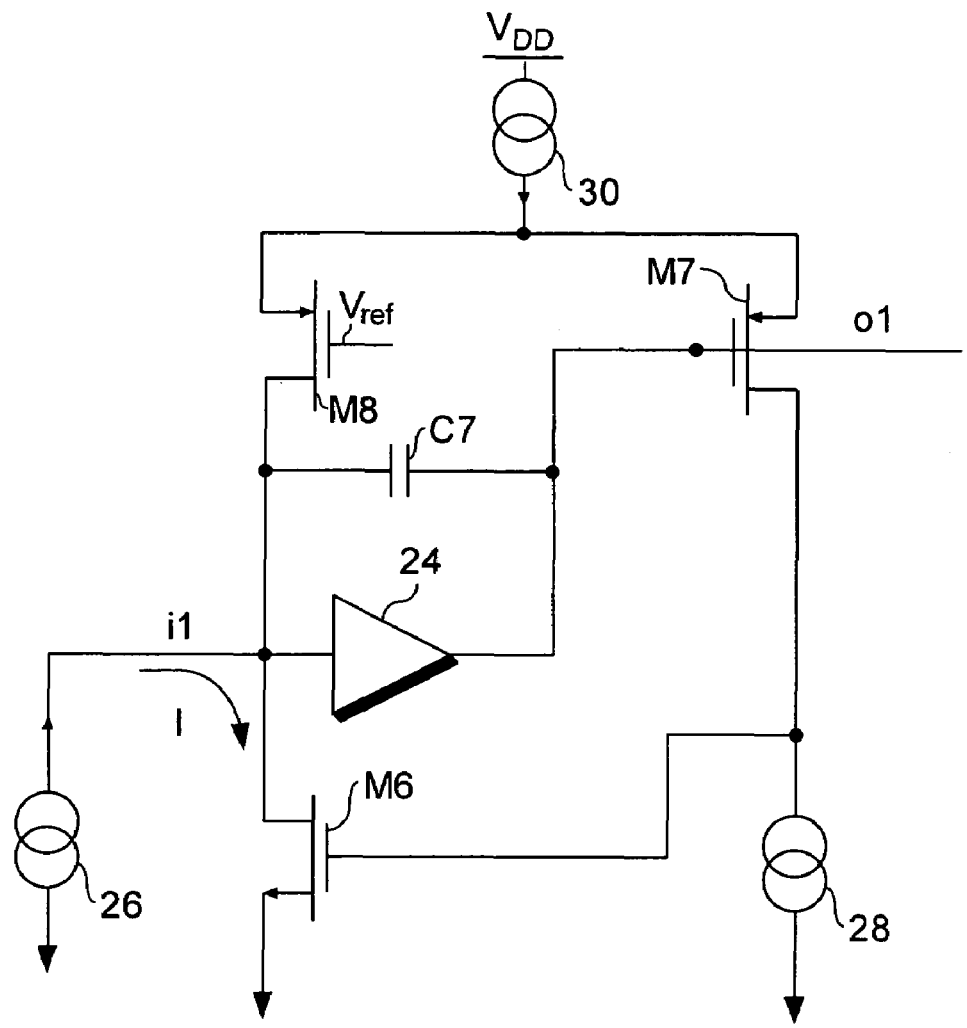
FIG. 5 is a block diagram of a conventional charge sensitive amplifier configured as a differential feedback amplifier.

The circuit configuration shown in FIG. 7 advantageously provides an improved dynamic range that is much wider than that for the configuration shown in FIG. 1. Specifically, the input operating point i1 shown in FIG. 7 is preferably about one threshold voltage of the signal amplifier 32 above ground. The output operating point o1, due to the inverter MOSFET M9, is preferably one threshold voltage of MOSFET M9 below the voltage source $V_{DD}$. Thus, the output terminal of the signal amplifier 32 must swing negative in response to a signal current and the output dynamic range, which is essentially in the range of $V_{DD} - V_T$, where $V_T$ is the threshold voltage of MOSFET M9, is much larger than the output dynamic range of the circuit configuration shown in FIG. 1.

The configuration shown in FIG. 7 provides for low noise, in which noise contributions from MOSFETs M9, M11 are substantially cancelled. Any perturbation generated at the gate of MOSFET M11, that is, any noise from MOSFETs M9, M11, is injected in the feedback capacitor C8 through MOSFET M10, ejected N-times by capacitors C9 through CN and reabsorbed N-times by MOSFET(s) M12 . . . MN to achieve cancellation. The overall noise contribution from the feedback circuit 34 is substantially equivalent to that of the circuit shown in FIG. 1.

It should be noted that the circuit shown in FIG. 1 requires an additional biasing circuit to dynamically adjust the resistance of the feedback. However, an additional advantage of the circuit shown in FIG. 7 is that it is self-biasing, which substantially reduces the complexity and number of components required to manufacture or implement the circuit.

Figure 8:
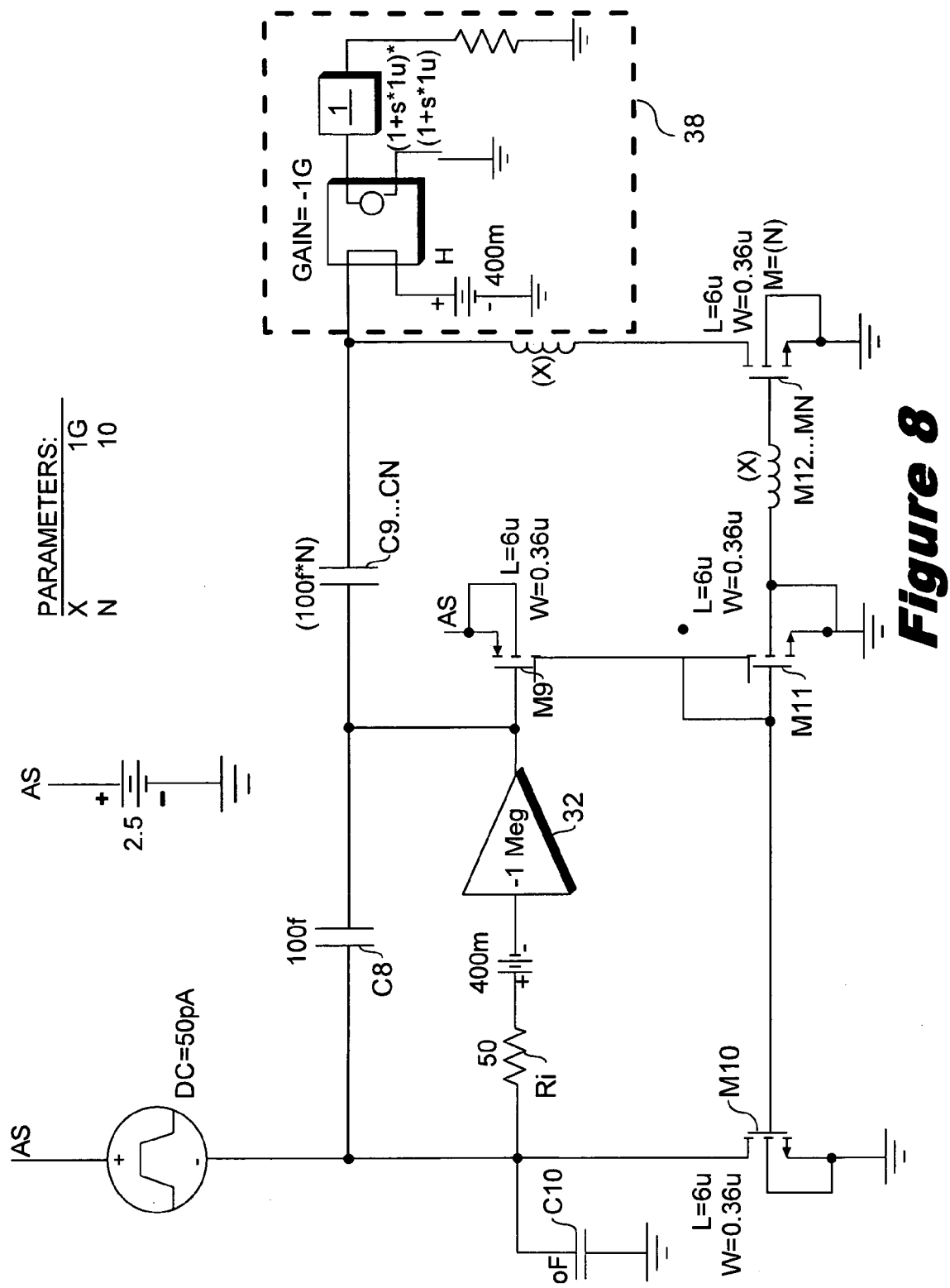
FIG. 8 is a schematic diagram of an embodiment of the present invention that is substantially similar to that shown in FIG. 10, which is used for computer simulation of noise contributions.

FIG. 8 is a schematic embodiment substantially similar to FIG. 7, which is used for computer simulation of noise contributions. Parametric values associated with the elements of the circuit shown in FIG. 8, such as input resistance, capacitance, amperage, and channel dimensions, are provided in proximity to the corresponding element. For instance, the signal amplifier 32 is represented as including an equivalent input noise resistance R1 of 50 ohms. A second order shaper circuit incorporating a 400 mV virtual ground is also used included in the representation of the signal amplifier 32.

Figure 9:
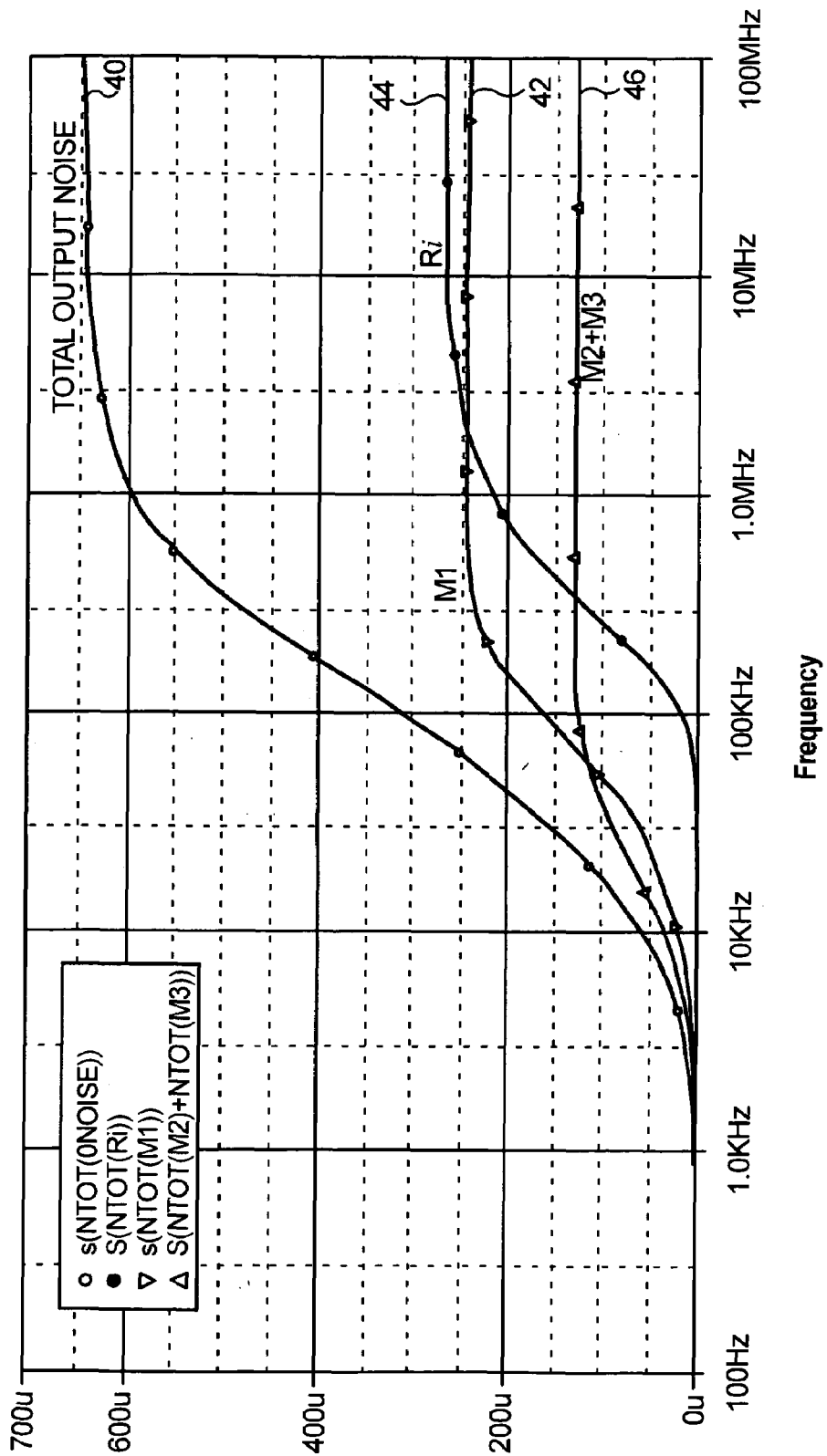
FIG. 9 is a graph of the total output noise and the noise of selected components given a value of inductance (1 GH) representative of the circuit shown in FIG. 7 without compensation provided by MOSFETs M12 . . . MN.
Figure 10:
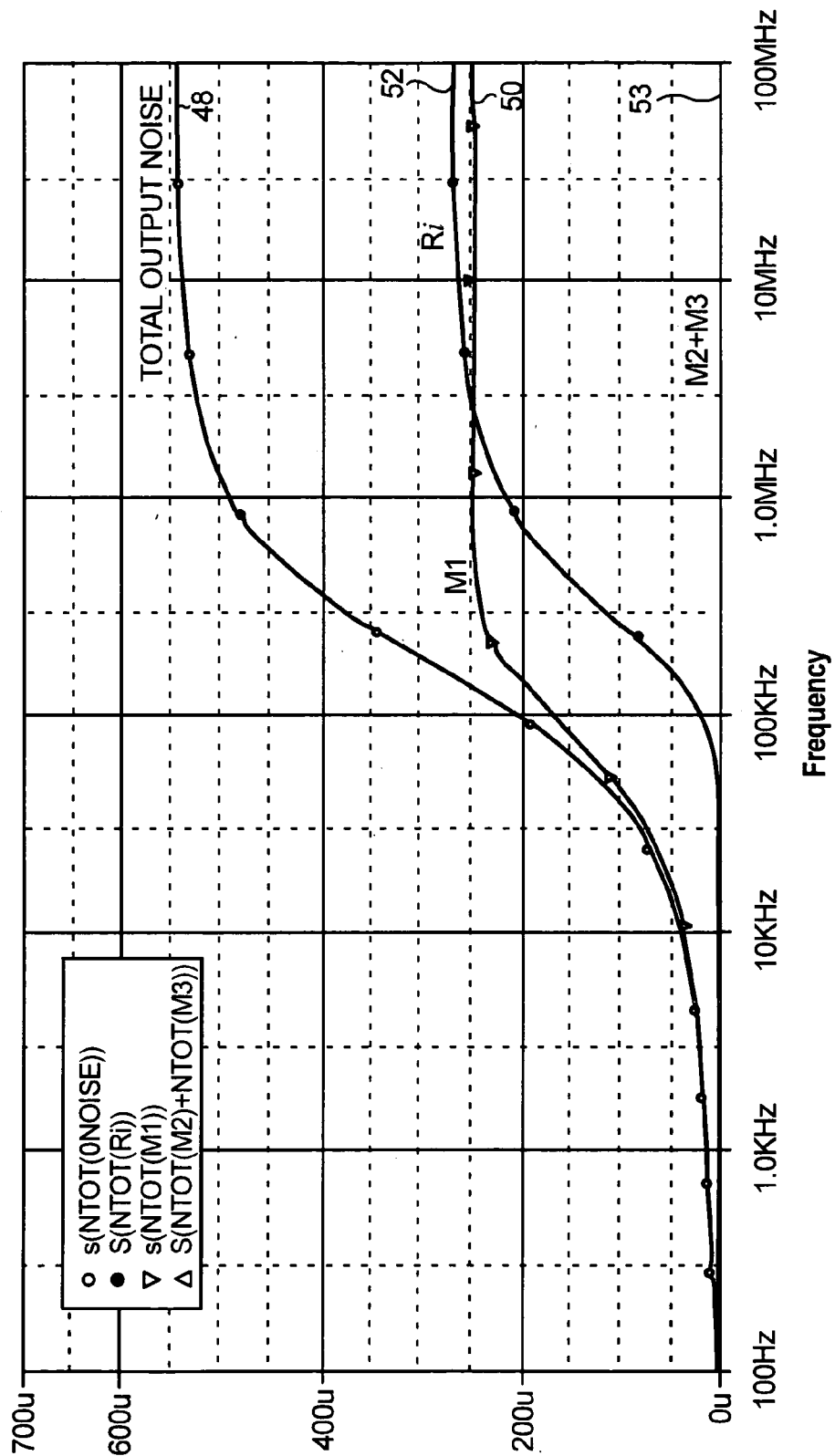
FIG. 10 is a graph of the total output noise and the noise of selected components given a value of inductance (1 fH) representative of the circuit shown in FIG. 7 with compensation provided by MOSFETs M12 . . . MN.

The simulations provide the total output noise and the noise of selected components for two values of the inductance: L=1 GH (open equivalent, corresponding to the conventional circuit shown in FIG. 1) as shown in FIG. 9, and L=1fH (short equivalent, corresponding to the compensated configuration shown in FIG. 11) as shown in FIG. 10. Specifically, the total output noise (645 μv) in FIG. 9 is shown by trace 40, the noise from MOSFET M10 is shown by trace 42, the noise from resistor R1 is shown by trace 44, and the noise from MOSFETs M9, M11 (131 μv) is shown by trace 46. Similarly, the total output noise (540 μv) in FIG. 10 is shown by trace 48, the noise from MOSFET M10 is shown by trace 50, the noise from resistor R1 is shown by trace 52, and the noise from MOSFETs M9, M11 (94 fv or 0.094 pv), which is negligible and shown as substantially equivalent to the baseline of the graph.

The results of the simulation show that the addition of the active element(s) MOSFET(s) M12. MN reduce noise, and thus improve resolution.

A time projection chamber that is preferably used with a laser electron gamma source was developed and is further described in G. De Geronimo et al., *Front-End ASIC for a GEM Based Time Projection Chamber*, Proceeding of IEEE Nuclear Science Symposium (2003), which is incorporated herein by reference. The chamber includes a can and a single-ended, dual-stage gas electron multiplier (GEM), with an associated anode plane that is pixellated into about eight thousand pads. The front-end electronics preferably provide energy, timing, and address information from those pads involved in measuring track of particles. For center of gravity determinations, this information is preferably sampled from an above-threshold pad and two adjacent pads. An efficient scheme for reading the approximately 8000 front-end channels between each measurement cycle is critical.

A 32-channel front-end application specific integrated circuit (ASIC) was developed to process signals from this detector. The ASIC is preferably fabricated in 0.25 μm CMOS technology and dissipates about 41 mW. As shown in the block diagram of FIG. 11, each channel of the ASIC preferably includes a low noise dual-stage charge amplifier 54, 55, in which the second stage amplifier 55 is preferably formed in accordance with the present invention, a shaping amplifier 56 with a band-gap referenced baseline stabilizer 58, a single threshold discriminator 60, a dual-phase peak detector 62, a timing detector 64, and logic circuitry 66 for neighbor enabling.

The front-end channel architecture preferably implements charge amplification, shaping with baseline stabilization, discrimination, peak detection, timing detection, neighbor-enabling logic, and multiplexing. The channel layout size is preferably about 150 μm×1425 μm and dissipates about 1.25 mW.

The first stage of the charge amplifier 54 collects electrons and provides the first low-noise amplification with continuous reset. An input MOSFET in the charge amplifier 54 is preferably an n-channel type with 63 fingers, each having a width-to-length ratio of about W/L=12 μm/0.36 μm, biased at about 100 μA, with gm/Cg of about 2.05 mS/1pF (where gm represents transconductance in units of millisiemens and Cg represents the gate capacitance of the MOSFET in units of picofarads). The configuration is preferably folded cascode with a source/cascode current ratio of about 9.

The continuous reset is further described in G. De Geronimo et al., *A CMOS Fully Compensated Continuous Reset System*, IEEE Transactions on Nuclear Science, Vol. 47, No. 4, pp. 1458–1462 (2000), which is incorporated herein by reference, with a p-channel feedback MOSFET, Cf=250fF, and a charge gain N1 adjustable from 16 to 30 in eight steps. This preferably provides gain adjustment from 17 mV/fC to 32 mV/fC to compensate coarsely for the dispersion in gas gain. The feedback is preferably enabled through an internal current source of about 50 pA connected to the amplifier 54 input.

In order to minimize the noise contribution from the shaping amplifier 56, the charge amplifier gain N1 is preferably larger than 16 to 30. The charge amplifier 54 may be implemented using two conventional gain stages substantially similar to that shown in FIG. 1, where the second stage is similar to the first stage, except that the second stage incorporates a feedback MOSFET of opposite type to compensate for the polarity of the signals. In this way, it was possible to achieve larger charge gains of $N_1 \times N_2$, as described in Section II.B of G. De Geronimo, *A CMOS Fully Compensated Continuous Reset System*, IEEE Transactions on Nuclear Science, Vol. 47, No. 4, pp. 1458–1462 (2000) and in section III of G. De Geronimo et al., *Development of a High-Rate High-Resolution Detector for EXAFS Experiments*, IEEE Transactions on Nuclear Science, Vol. 50, pp. 885–891 (2003), which are incorporated herein by reference.

However, the use of an n-channel input MOSFET for a voltage amplifier sets the quiescent point of its input to about 400 mV. Thus, the feedback current from the first stage, multiplied by N1, must flow through the p-channel feedback MOSFET of the second stage, which forces the quiescent point of its output to about 300 mV. Thus, the output, which must swing negatively, strongly limits the dynamic range when implementing the charge amplifier with conventional gain stages.

The charge sensitive amplifier formed in accordance with the present invention provides a performance comparable to the conventional configuration shown in FIG. 1 without the associated dynamic range limitation. As discussed above, the amplifier of the present invention is shown schematically in FIG. 7 and has a charge gain of $-N$, where N is the ratio between the number of replica elements, capacitor(s) C9 . . . CN and MOSFET(s) M12 . . . MN, and the feedback elements, capacitor C8 and MOSFET M10. As in the conventional configuration, the second stage must exhibit a virtual ground with its quiescent point matched to the input. The non-linearity introduced by MOSFET M10 during the discharge process can be shown to be fully compensated by MOSFET(s) M12 . . . MN.

As a consequence, the performance of the amplifier in accordance with the present invention, in terms of linearity and self-adaptability to leakage currents, is substantially equivalent to the conventional configuration shown in FIG. 1. However, the configuration shown in FIG. 7, advantageously provides a much larger output dynamic range, which is only limited by $V_{DD}-V_T$, where $V_{DD}$ is the positive voltage source and $V_T$ is the threshold voltage of MOSFET M9.

Concerning the noise contribution from MOSFETs M9 and M11, it can be shown that, due to the mirror action of MOSFETs M10 and M12 . . . MN, it is substantially cancelled. Noise perturbations originating at the gate terminal of MOSFET M11 generates a current through MOSFET M10, and capacitors C8 and C9 . . . CN that is substantially absorbed by MOSFET(s) M12 . . . MN, and does not contribute to the output. The noise contribution of MOSFETs M10 and M12. MN is substantially similar to that of the conventional configuration shown in FIG. 1.

The circuit configuration in accordance with the present invention shown in FIG. 7 also provides an ideal complement to the conventional configuration shown in FIG. 1. Cascading the two stages is preferably used when front-ends in low-voltage technologies require high gain, low noise, high linearity, and large dynamic range. The configuration of the present invention provides performance substantially equivalent to the conventional configuration. In addition, the configuration shown in FIG. 7 may be used as an input stage, while the conventional configuration shown in FIG. 1 is used as a second stage when, for example, the front-end collects holes or utilizes p-channel input MOSFETs.

Figure 11:
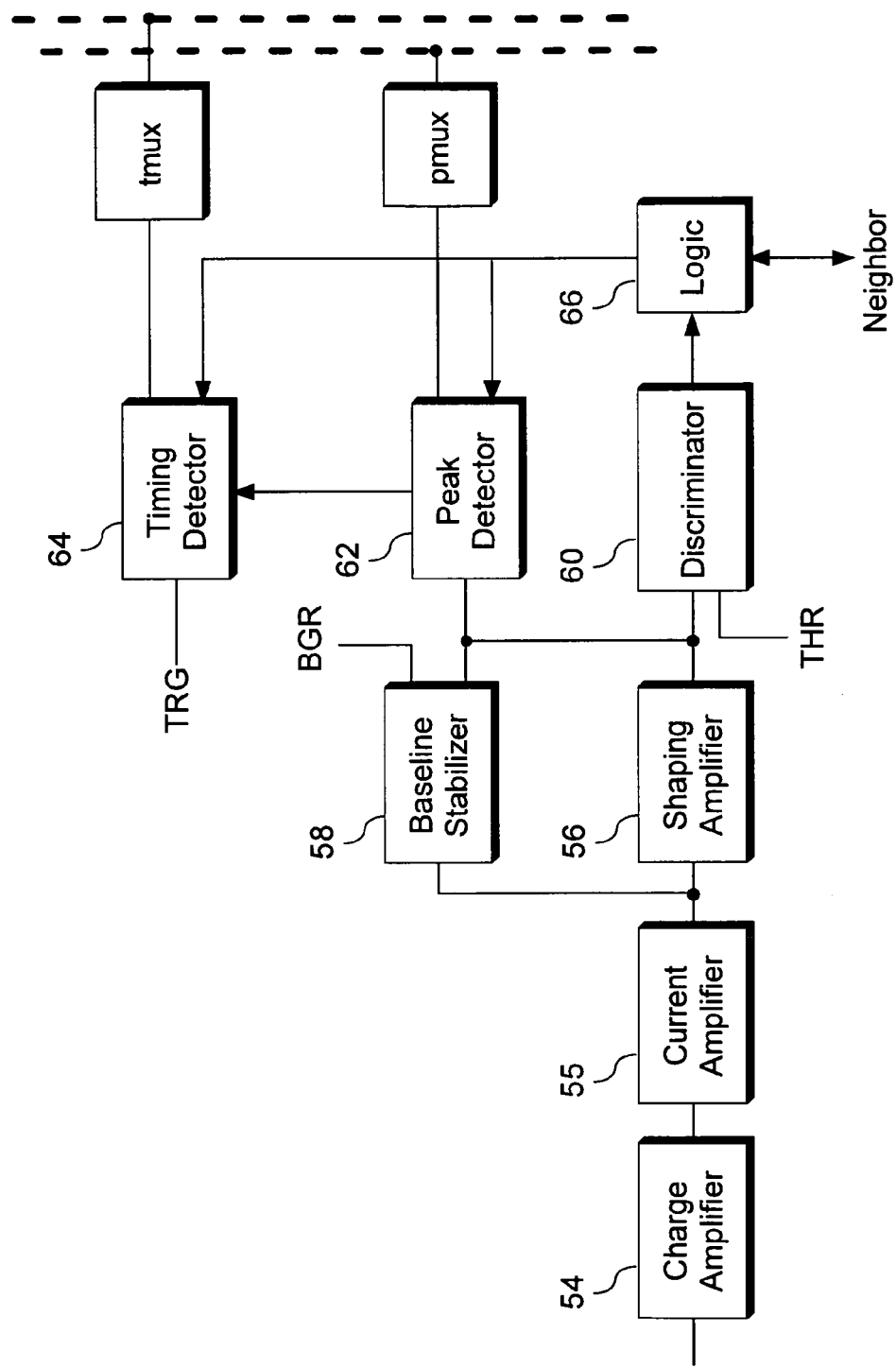
FIG. 11 is a block diagram of one channel of an application specific integrated circuit (ASIC) incorporating the charge sensitive amplifier formed in accordance with the present invention.

The shaping amplifier 58 in FIG. 11 preferably provides current-to-voltage conversion by using two amplifiers in cascade. The amplifier 58 is preferably a second order filter suitable for low rate applications with 600 ns peaking time and is designed for rail-to-rail operation. The output baseline is preferably stabilized using a baseline holder circuit, which is further described in G. De Geronimo et al., *A CMOS Baseline Holder for Readout ASICs*, IEEE Transactions on Nuclear Science, Vol. 47, pp. 818–822 (2000), which is incorporated herein by reference, and is preferably referenced to about a 200 mV bandgap reference circuit.

The discriminator 60 preferably provides a trigger that enables peak detection and timing detection for the above-threshold channel and its two neighboring channels sharing the same radius on the pad plane. In this way, it is possible, with further downstream processing, to evaluate the center of gravity and locate the position of an event with a resolution better than 200 $\mu$m rms for straight tracks. The peak detector 62 is preferably a high-accuracy, two-phase configuration of the type described in G. De Geronimo et al., *Analog CMOS Peak Detect and Hold Circuits—Part 2. The Two-Phase Offset-Free and Derandomizing Configuration*, Nuclear Instruments and Methods, A484, pp. 544–556 (2002), and U.S. Pat. No. 6,512,399, which are incorporated herein by reference.

The timing detector 64 is preferably based on a single-ramp time-to-amplitude converter (TAC), in which a voltage ramp is either generated on chip or provided externally. A trigger for the ramp-start is preferably generated by a scintillator associated with the TAC at the beginning of each measurement cycle. The trigger for the ramp-stop is preferably generated by a peak-found signal from the peak detector 62. Amplitude and timing information is preferably stored as voltages on hold capacitors of about 2 pF, and routed through multiplexers to dedicated output buffers during the readout process for external analog-to-digital conversion.

From the foregoing discussion, it will be appreciated by those skilled in the art that the charge sensitive amplifier formed in accordance with the present invention provides a stable, high-resistance feedback circuit with low-feedback capacitance, which maximizes dynamic range at its output while minimizing the number of components. The charge sensitive amplifier also exhibits low sensitivity to variations in both manufacturing process parameters, such as threshold voltage, and operating parameters, such as supply voltage and temperature.

It will also be appreciated by those skilled in the art that the charge sensitive amplifier formed in accordance with the present invention minimizes noise contributions and non-linearity, does not require adjustment after the amplifier is fabricated, and remains continuously sensitive to input signals even in the presence of leakage current. In addition, the charge sensitive amplifier provides a compensating reduction in the feedback resistance in the presence of leakage current, thereby preventing the amplifier from saturating. Further, the charge sensitive amplifier may be manufactured using standard, commercially available, complimentary metal oxide semiconductor (CMOS) fabrication methods.

It will also be appreciated by those skilled in the art that the charge sensitive amplifier formed in accordance with the present invention provides a cancellation circuit that compensates for both the linear and non-linear characteristics of the feedback circuit. Further, the charge sensitive amplifier is self-biasing.

Although illustrative embodiments of the present invention have been described herein with reference to the accompanying drawing, it is to be understood that the invention is not limited to those precise embodiments, and that various other changes and modifications may be effected therein by one skilled in the art without departing from the scope or spirit of the invention.

What is claimed is:

1. A charge amplifier, the charge amplifier comprising:
    a signal amplifier, the signal amplifier comprising an input terminal and an output terminal,
    a feedback circuit, the feedback circuit comprising a first capacitor, an inverter, and a current mirror circuit, the first capacitor being electrically coupled in parallel across the input terminal and the output terminal of the signal amplifier, the inverter being operatively coupled to the output terminal of the signal amplifier, the current mirror circuit being operatively coupled to the input terminal of the signal amplifier; and
    a cancellation circuit, the cancellation circuit being operatively coupled to the output terminal of the signal amplifier.

2. The charge amplifier, as defined by claim 1, wherein the inverter comprises at least one field effect transistor.

3. The charge amplifier, as defined by claim 2, wherein the at least one field effect transistor of the inverter comprises a source terminal, a drain terminal, and a gate terminal, the gate terminal being operatively coupled to the output terminal of the signal amplifier, the source terminal being operatively coupled to a voltage source, the drain terminal being operatively coupled to the current mirror circuit.

4. The charge amplifier, as defined by claim 1, wherein the current mirror circuit comprises at least one field effect transistor.

5. The charge amplifier, as defined by claim 4, wherein the current mirror circuit comprises a first field effect transistor and a second field effect transistor, each of the first and second field effect transistors comprising a source terminal, a drain terminal, and a gate terminal, the drain terminal of the first field effect transistor being operatively coupled to the input terminal of the signal amplifier, the source terminal of the first field effect transistor being operatively coupled to ground, the gate terminal of the first field effect transistor being operatively coupled to the gate terminal of the second field effect transistor and the drain terminal of the second field effect transistor, the source terminal of the second field effect transistor being operatively coupled to ground.

6. The charge amplifier, as defined by claim 5, wherein the cancellation circuit comprises a second capacitor and a third field effect transistor, the third field effect transistor being substantially matched to the first field effect transistor.

7. The charge amplifier, as defined by claim 1, wherein the cancellation circuit comprises a second capacitor and a third field effect transistor.

8. The charge amplifier, as defined by claim 7, wherein the second capacitor is substantially matched to the first capacitor.

9. The charge amplifier, as defined by claim 7, wherein the second capacitor comprises a first terminal and a second terminal, the third field effect transistor comprising a source terminal, a drain terminal, and a gate terminal, the first terminal of the second capacitor being operatively coupled to the output terminal of the signal amplifier, the second terminal of the second capacitor being operatively coupled to the drain terminal of the third field effect transistor, the gate terminal of the third field effect transistor being operatively coupled to the current mirror circuit, the source terminal of third field effect transistor being operatively coupled to ground.

10. The charge amplifier, as defined by claim 9, wherein the cancellation circuit further comprises at least one additional capacitor electrically coupled in parallel to the second capacitor, the cancellation circuit further comprising at least one additional field effect transistor comprising a source terminal, a drain terminal, and a gate terminal, the gate terminal of the at least one additional field effect transistor being operatively coupled to the gate terminal of the third field effect transistor, the drain terminal of the at least one additional field effect transistor being operatively coupled to the drain terminal of the third field effect transistor, the source terminal of the at least one additional field effect transistor being operatively coupled to the source terminal of the third field effect transistor.

11. The charge amplifier, as defined by claim 10, wherein a quantity of the at least one additional capacitor and a quantity of the at least one additional field effect transistor are substantially the same.

12. The charge amplifier, as defined by claim 1, further comprising a third capacitor, the third capacitor being operatively coupled between the input terminal of the signal amplifier and ground.

13. The charge amplifier, as defined by claim 1, further comprising a fourth capacitor, the fourth capacitor being operatively coupled between the current mirror circuit and ground.

14. A method of charge amplification, the method comprising the steps of:
    providing a signal amplifier, the signal amplifier comprising an input terminal and an output terminal;
    coupling a first capacitor electrically in parallel across the input terminal and the output terminal of the signal amplifier;
    coupling an inverter operatively to the output terminal of the signal amplifier;
    coupling a current mirror circuit operatively to the input terminal of the signal amplifier; and
    coupling a cancellation circuit operatively to the output terminal of the signal amplifier.

15. The method of charge amplification, as defined by claim 14, wherein the inverter comprises at least one field effect transistor.

16. The method of charge amplification, as defined by claim 15, wherein the at least one field effect transistor of the inverter comprises a source terminal, a drain terminal, and a gate terminal, the method further comprising the steps of:
    coupling the gate terminal operatively to the output terminal of the signal amplifier;
    coupling the source terminal operatively to a voltage source; and
    coupling the drain terminal operatively to the current mirror circuit.

17. The method of charge amplification, as defined by claim 14, wherein the current mirror circuit comprises at least one field effect transistor.

18. The method of charge amplification, as defined by claim 17, wherein the current mirror circuit comprises a first field effect transistor and a second field effect transistor, each of the first and second field effect transistors comprising a source terminal, a drain terminal, and a gate terminal, the method further comprising the steps of:
    coupling the drain terminal of the first field effect transistor operatively to the input terminal of the signal amplifier;
    coupling the source terminal of the first field effect transistor operatively to ground;
    coupling the gate terminal of the first field effect transistor operatively to the gate terminal of the second field effect transistor and the drain terminal of the second field effect transistor; and
    coupling the source terminal of the second field effect transistor operatively to ground.

19. The method of charge amplification, as defined by claim 18, wherein the cancellation circuit comprises a second capacitor and a third field effect transistor, the method further comprising the step of matching the third field effect transistor substantially to the first field effect transistor.

20. The method of charge amplification, as defined by claim 14, wherein the cancellation circuit comprises a second capacitor and a third field effect transistor.

21. The method of charge amplification, as defined by claim 20, wherein the method further comprises the step of matching the second capacitor substantially to the first capacitor.

22. The method of charge amplification, as defined by claim 20, wherein the second capacitor comprises a first terminal and a second terminal, the third field effect transistor comprising a source terminal, a drain terminal, and a gate terminal, the method further comprising the steps of:
    coupling the first terminal of the second capacitor operatively to the output terminal of the signal amplifier;
    coupling the second terminal of the second capacitor operatively to the drain terminal of the third field effect transistor;
    coupling the gate terminal of the third field effect transistor operatively to the current mirror circuit; and
    coupling the source terminal of third field effect transistor operatively coupled to ground.

23. The method of charge amplification, as defined by claim 22, wherein the cancellation circuit further comprises at least one additional capacitor and at least one additional field effect transistor, the at least one additional field effect transistor comprising a source terminal, a drain terminal, and a gate terminal, the method further comprising the steps of:
    coupling the at least one additional capacitor electrically in parallel to the second capacitor;
    coupling the gate terminal of the at least one additional field effect transistor operatively to the gate terminal of the third field effect transistor;
    coupling the drain terminal of the at least one additional field effect transistor operatively coupled to the drain terminal of the third field effect transistor; and
    coupling the source terminal of the at least one additional field effect transistor operatively to the source terminal of the third field effect transistor.

24. The method of charge amplification, as defined by claim 23, wherein a quantity of the at least one additional capacitor and a quantity of the at least one additional field effect transistor are substantially the same.

25. The method of charge amplification, as defined by claim 14, further comprising the step of coupling a third capacitor operatively between the input terminal of the signal amplifier and ground.

26. The method of charge amplification, as defined by claim 14, further comprising the step of coupling a fourth capacitor operatively coupled between the current mirror circuit and ground.

27. A front-end system for use with a radiation sensor, the front-end system comprising:
- a charge amplifier, the charge amplifier receiving a signal from the radiation sensor representing detection of an event, the charge amplifier comprising:
  - a signal amplifier, the signal amplifier comprising an input terminal and an output terminal;
  - a feedback circuit, the feedback circuit comprising a first capacitor, an inverter, and a current mirror circuit, the first capacitor being electrically coupled in parallel across the input terminal and the output terminal of the signal amplifier, the inverter being operatively coupled to the output terminal of the signal amplifier, the current mirror circuit being operatively coupled to the input terminal of the signal amplifier; and
  - a cancellation circuit, the cancellation circuit being operatively coupled to the output terminal of the signal amplifier; and
- at least one of a current amplifier, a shaping amplifier, a baseline stabilizer, a discriminator, a peak detector, a timing detector, and a logic circuit, the at least one of a current amplifier, shaping amplifier, baseline stabilizer, discriminator, peak detector, timing detector, and logic circuit being operatively coupled to the charge amplifier.

* * * * *